United States Patent [19]

Till

[11] Patent Number: 4,760,495

[45] Date of Patent: Jul. 26, 1988

[54] STAND-OFF DEVICE

[75] Inventor: David P. Till, Sturbridge, Mass.

[73] Assignee: Prime Computer Inc., Natick, Mass.

[21] Appl. No.: 40,047

[22] Filed: Apr. 16, 1987

[51] Int. Cl.⁴ .............................................. H05K 1/14
[52] U.S. Cl. ................... 361/412; 411/173;
 411/177; 411/508; 411/509; 411/55; 411/57;
 411/182; 174/138 D; 403/408.1; 403/168
[58] Field of Search ............ 411/173, 177, 55, 56,
 411/57, 59, 60, 338, 77, 508–510, 182, 172;
 174/138 D; 24/297; 403/168, 167, 408.1, 248;
 361/412

[56] References Cited

U.S. PATENT DOCUMENTS

| 2,649,884 | 8/1953 | Westover | 411/182 X |
|---|---|---|---|
| 2,936,015 | 5/1960 | Rapata | 174/138 D |
| 2,984,698 | 5/1961 | Strauss | 411/510 X |
| 3,854,374 | 12/1974 | Boyle et al. | 411/57 |
| 4,259,890 | 4/1981 | Walsh | 411/55 X |
| 4,502,193 | 3/1985 | Harmon et al. | 24/297 X |
| 4,537,542 | 8/1985 | Pratt et al. | 411/77 X |
| 4,579,492 | 4/1986 | Kazino et al. | 411/182 X |
| 4,596,297 | 6/1986 | Skibinski | 174/138 D X |

FOREIGN PATENT DOCUMENTS

| 206090 | 4/1955 | Australia | 24/297 |
|---|---|---|---|
| 1320839 | 2/1963 | France | 24/297 |
| 2315030 | 1/1977 | France | 411/60 |
| 445206 | 2/1968 | Switzerland | 411/55 |
| 637413 | 5/1950 | United Kingdom | 411/173 |

Primary Examiner—Gary L. Smith
Assistant Examiner—Curtis B. Brueske
Attorney, Agent, or Firm—Wolf, Greenfield & Sacks

[57] ABSTRACT

An improved stand-off device is disclosed which is used to control the spacing between adjacent planar elements in electronic instrumentation. The stand-off device includes a resilient, hollow shell member and a rigid, cylindrical inner element. The shell member has at least one slot extending from one end, and has a top interior cylindrical surface, a bottom interior cylindrical surface, and a threaded intermediate interior surface. The inner element has a conical expander portion and a drive portion with a threaded exterior surface which is complementary to the threaded interior intermediate surface of the shell member. The slotted end of the shell member is adapted for insertion into an aperture in a planar member from one side of that member. The inner element is adapted for insertion into the shell member from the same side of that member, whereupon the conical portion forces the slotted end of the shell member to expand and engage the perimeter of the aperture in the planar member.

9 Claims, 2 Drawing Sheets

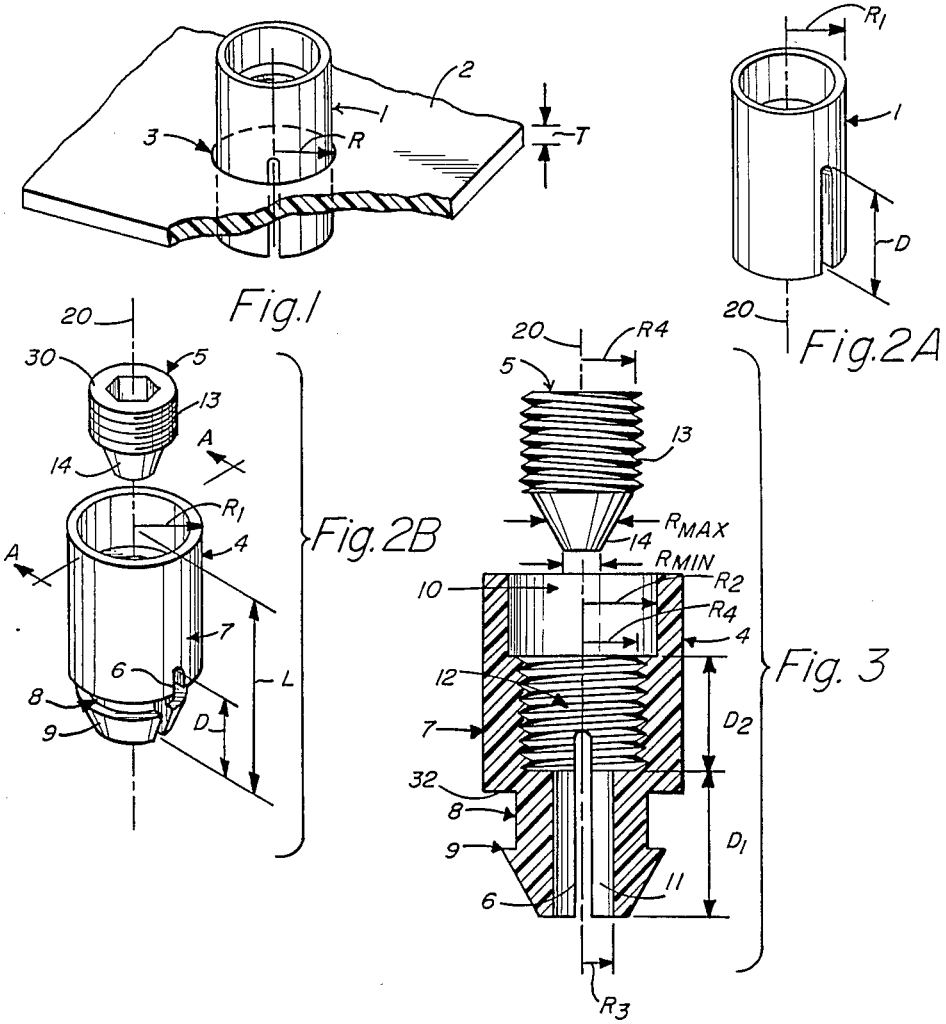
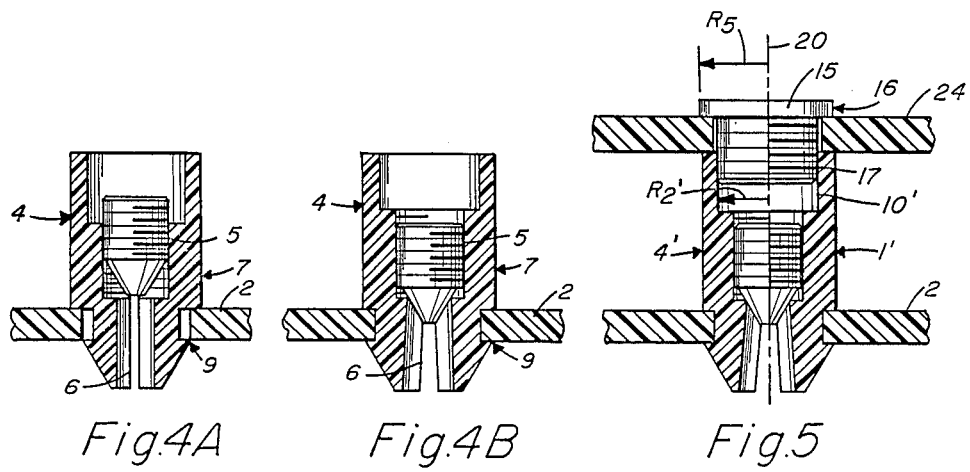

STAND-OFF DEVICE

BACKGROUND OF THE DISCLOSURE

The present invention relates to electronic instrumentation, and more particularly, to improvements in devices used to control the spacing between adjacent elements in such instrumentation.

The precise positioning of component parts, such as planar elements in the form of printed circuit boards, of an electronic instrument can be requisite to the correct functioning of that instrument. Proper alignment of adjacent printed circuit boards, or the like, has been accomplished in the prior art by devices such as stand-offs.

In one form, such stand-offs have an elongated generally cylindrical body member with a threaded shank extending from one end. In the use of such stand-offs, the threaded shank is inserted through a hole in a first printed circuit board and held in place by a nut screwed on to the shank. The body member of the stand-off establishes separation between the first board and another element, such as an adjacent board. However, access to both sides of the first board is necessary to install or remove the stand-offs, should that become necessary.

In another form, prior art stand-offs may include an elongated body member having a shank extending from one end which is adapted to be press-fit into an aperture in a printed circuit board. While such stand-offs can establish a desired separation, and only require access to one side of the board for insertion or removal, the removal of such a device, for example during field-servicing of the instrument, often results in cracking of the board near the aperture, despite attempts to regulate the shear forces required for its removal of the stand-off.

Accordingly, it is an object of the present invention to provide an improved stand-off device which can be easily replaced in the field without destruction of the boards to which it is attached, and without disrupting the positioning of the other components of the instrument.

SUMMARY OF THE INVENTION

Briefly, the present invention is directed to removable stand-off devices which may be used to separate substantially rigid, planar members. The device includes two constituents: (1) a resilient, hollow, shell member which is slotted at a first end and which fits into an aperture in a planar member, and (2) a rigid cylindrical element which, when fit into the shell element, causes the slotted end of the shell member to engage the perimeter of the aperture, thereby securing the stand-off firmly to the planar member.

The shell member has an exterior surface which at the slotted end has a cross-section that is substantially similar to, but smaller than that of the aperture. The shell member has an interior surface comprising a cylindrical top portion at the end opposite the slotted end, a circular and cylindrical bottom portion at the slotted end, and a threaded cylindrical intermediate portion between the top and bottom portions. The radius of the bottom portion is less than that of the top portion and the intermediate portion radius is greater than that of the bottom portion, but less than that of the top portion.

The rigid cylindrical element includes a threaded drive portion and an expander portion. The threaded drive portion has a thread pattern that is complementary to that of the interior intermediate portion of the shell member. The expander portion which includes a substantially conical surface having a maximum radius larger than or equal to that of the bottom portion of the interior surface of the shell element, and a minimum radius less than that of the bottom portion of the interior surface of the shell.

In a preferred form of the invention, the shell member has a pair of opposing slots extending a predetermined distance from one end of the shell along a reference axis. In this form, the shell member further comprises an exterior surface with a circular periphery and a radial lip extending from the slot end.

In yet another embodiment, the stand-off device further comprises a third element which may serve to secure the shell member to a second planar member at the end opposite the slotted end. This rigid and cylindrical fastening element may be in the form of a screw including drive portion (or head) having a radius greater than that of the top interior portion of the shell member, and a threaded shank portion with a thread pattern that is complementary to the top portion of the interior surface of the shell member which, in this form of the invention, is threaded.

BRIEF DESCRIPTION OF THE DRAWINGS

The foregoing and other objects of this invention, the various features thereof, as well as the invention itself, may be more fully understood from the following description, when read together with the accompanying drawings in which:

FIG. 1 shows a perspective view of a stand-off device embodying the invention functionally inserted in a printed circuit board;

FIG. 2A shows a perspective view of one embodiment of the shell member;

FIG. 2B shows a perspective exploded view of another embodiment of the shell member and the inner element of a stand-off device in accordance with the present invention;

FIG. 3 shows a sectional view along lines A—A of the shell member and inner element of the stand-off device of FIG. 2B;

FIG. 4A shows sectional view of the shell member and the inner element of an exemplary stand-off device where the slotted portion of the shell member is in its unexpanded state;

FIG. 4B shows a sectional view of the shell member and the inner element with the slotted portion of the shell member in its expanded state;

FIG. 5 shows a sectional view of the shell member, the inner element, and the fastener of an exemplary stand-off device, functionally engaging two printed circuit boards.

DESCRIPTION OF THE PREFERRED EMBODIMENT

Figure 6:
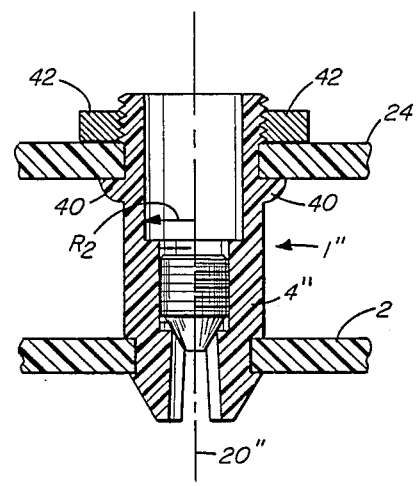
FIG. 6 shows a sectional view of another embodiment of the invention.

FIG. 1 shows a perspective view of a stand-off device 1 embodying the present invention, where the device 1 engages a substantially planar sheet member 2. By way of example, sheet member 2 may be a rigid element, such as a conventional type glass-epoxy printed circuit board, or stack of such boards.

As shown in FIG. 1, stand-off device 1 has been inserted through aperture 3 which passes from top to bottom of a planar member 2 having thickness T. The aperture has a radius R. In the illustrated application of the invention, planar member 2 is a printed circuit board. FIG. 2A shows a perspective view of the shell of the stand-off device 1. That shell has a cylindrical outer surface with a slot of length D extending from the first end.

FIG. 2B, shows an exploded view of stand-off device 1 which includes a hollow shell member 4 and an inner element 5. The shell member 4 is composed of a resilient material, such as nylon, and extends along a central reference axis 20. A slot 6 extends from a first end of the shell member 4 a distance D in the direction of the reference axis 20. In the preferred embodiment, shell member 4 has an additional slot opposite the first (not shown in FIG. 2A), where the second slot extends a distance equal to or greater than D in the direction of axis 20. The upper portion of the exterior surface of shell member 4 has a circular periphery having radius R1 at and extending from its slotted end. That exterior surface of the shell has a cylindrical shape with a substantially circular cross-section.

In the embodiment of FIG. 2B, the exterior surface of shell 4 includes a cylindrical top portion 7 having radius R1, extending from a second end opposite the first, and includes a smaller radius cylindrical bottom portion 8 extending from the first end. In the preferred embodiment shown in FIG. 2B, the exterior surface portion 8 additionally includes a lip 9 extending radially away from the axis 20. The lip has a dimension such that the overall radius of that end is less than R, so that the device may be easily inserted into, or removed from, a hole of radius R in the planar member. In various alternate embodiments, the outer surface of the portion of shell member 4 extending from the non-slotted end may have a cross-section other than circular, e.g., square or hexagonal, permitting use of a wrench to hold the shell member in a desired orientation during insertion or removal. In this or other forms of the invention, the portion of shell member 4 adapted for insertion into a hole in the planar member may have a cross-section other than circular, for use with correspondingly shaped holes in a planar member.

FIG. 3 shows a cross-sectional view along lines A—A of the preferred embodiment of the device 1 illustrated in FIG. 2B. The interior surface includes several portions: a top portion 10 extending from the second end of the shell 4, and having a radius R2 which is less than R1; a cylindrical bottom portion 11 extending a distance D1 from the first end of the shell member 4 in the direction of the reference axis, and which has a radius R3 which is less than R2; and a threaded intermediate portion 12 extending a distance D2 in the direction of the reference axis, and having a radius R4 which is less than or equal to R2, and where D1 is less than D. In cases where $R_2=R_4$, then the top portion 10 and the intermediate portion 12 may effectively form a "single" portion. In another embodiment, top portion 10 is threaded, as described below in conjunction with FIG. 5.

As shown in FIGS. 2B and 3, the inner element 5 is a solid, substantially rigid, cylindrical element having a maximum radius R4, and having form from nylon, for example. The element 5 includes a drive portion 13 extending from a drive end. The drive portion 13 has a threaded lateral surface with a thread pattern which is complementary to that of the threaded intermediate interior surface 12 of shell 4. The element 5 also has an expander portion 14 extending from the end opposite the drive end. The expander portion includes a substantially conical surface having a maximum radius $R_{max}$ larger than R3, and a minimum radius $R_{min}$ less than R3. As used herein, the term "conical" refers to a cone-shaped surface with either a linear taper (as illustrated) or a non-linear (e.g., exponential) taper. The surface 30 of the drive end may include a hexagonal cross-section hole extending in the direction of the longitudinal axis of that cylindrical element 5, to permit an allen wrench, for example, to drive the inner element 5 in a rotational motion about its longitudinal axis.

In an exemplary use of the stand-off device 1 of FIGS. 2B and 3, the shell member 4 is inserted through aperture 3 in the printed circuit board 2 from one side. In this orientation, the shoulder 32 of the top exterior portion 7 and lip 9 of the shell member 4 become flush with the printed circuit board 2. Inner element 5, including a means to contact a screw driver on its drive portion 13, is then inserted into the shell member 4 from the same side from which shell member 4 was inserted into printed circuit board 2. Element 5 screwed into the intermediate interior portion 12 of shell member 4 from the drive portion 13. As the conical expander portion 14 contacts the top portion of bottom interior portion 11, the portions of shell 4 defining slot 6 are forced apart. This spreading action secures shell member 4 to the sides of the aperture 3 in printed circuit board 2.

Removal of the stand-off device 1 is accomplished by reversing the insertion procedure: inner element 5 is unscrewed from shell member 4, allowing the shell member 4 to resume its unexpanded conformation, and thereby enabling it to become disengaged from printed circuit board 2. The shell member 4 is then removed from the same side from which it was inserted.

FIGS. 4A and 4B show cross-sectional views of a stand-off device 1 with the slotted end of the shell member 4 unexpanded and expanded, respectively. In FIG. 4B, the expanded portion is engaged with the periphery of aperture 3 in the printed circuit board 2.

FIG. 5 shows another embodiment of the stand-off device 1'. The stand-off device 1' further comprising a solid, substantially rigid, cylindrical screw fastener 15. The screw fastener 15 includes a drive portion 16 extending from a drive end, and having a radius R5 which is greater than R2'. Fastener 15 also includes a threaded shank portion 17 having radius R2' and an exterior surface with thread pattern which is complementary to that of the threaded interior top portion 10' of the shell member 4'.

The shank portion 17 of screw fastener 15 is adapted to pass through an aperture in a second planar member 24, so that the planar member 24 is secured against shell member 4', and is separated from the planar member 2, as shown on FIG. 5.

FIG. 6 shows another device 1" embodying the invention. Device 1" is similar to the device 1' of FIG. 5 except that device 1" also has a lip portion 40 extending in a direction away from axis 20" and the outer surface of shell member 4" is threaded at its top section, as illustrated. With this configuration, a second board 24 having a hole with radius R1 may be placed over the shell member 4" and secured with a nut 42 over the threaded outer surface of shell member 4", as illustrated in FIG. 6.

The invention may be embodied in other specific forms without departing from the spirit of essential characteristics thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. In combination, a stand-off device and a pair of circuit boards, said stand-off device for removable attachment with said pair of cirucit boards, said stand-off device maintaining said pair of circuit boards in spaced parallel relationship, said circuit boards each having an aperture extending therethrough with the respective apertures coaxially disposed, said stand-off device comprising, a resilient hollow shell having a shell axis coincident with said aperture axes, having a lower portion including an annular channel adapted to engage with one of said circuit boards and slot means extending orthogonal to said annular channel and adapted to resiliently deflect from a rest position in which the lower portion inserts into the aperture in said one circuit board to align said one circuit board with said annular channel, and a deflected position in which said annular channel interlocks with said one cirucit board, having an intermediate portion including an internally threaded bore, and having an upper portion incuding a support surface for the underside of said other circuit board, a rigid inner element having a drive poriton and an expander portion said drive portion having a threaded outer surface engaged in said intermediate portion threaded bore, said expander portion having means engaging said shell lower portion to move said shell lower portion to its deflected position to interlock said annular channel and said one circuit board, and fastener means axially spaced from said rigid inner element and having a drive portion cooperating with said shell upper portion to secure said fastener means thereto and a securing surface for receiving the topside of said other circuit board to clamp said other circuit board between said shell and fastener means and in a position spaced from said one circuit board.

2. The combination of claim 1 wherein said slot means comprises at least a first slot.

3. The combination of claim 2 including a second slot disposed diametrically opposite said first slot.

4. The combination of claim 1 wherein said shell is of generally cylindrical shape with a substantially circular cross-section.

5. The combination of claim 1 wherein said expander portion means engaging the shell slot means comprises means defining a conic surface.

6. The combination of claim 1 wherein said fastener means drive portion comprises a screw fastener adapted to be threaded into a threaded internal bore of said shell upper portion.

7. The combination of claim 6 wherein said fastener means securing surface is defined by a flange of the drive portion tightened against the top side of said other circuit board.

8. The combination of claim 1 wherein said fastener means comprises a fastener nut and said shell upper portion is externally threaded at a location above said other circuit board to engage with said fastener nut.

9. The combination of claim 8 wherein said upper portion support surface is defined by a lip for supporting the underside of said other circuit board.

* * * * *